US007940832B2

(12) United States Patent
Schlegel et al.

(10) Patent No.: US 7,940,832 B2
(45) Date of Patent: *May 10, 2011

(54) METHOD AND APPARATUS FOR EFFICIENT WALSH COVERING AND SUMMING OF SIGNALS IN A COMMUNICATION SYSTEM

(75) Inventors: Nikolai Schlegel, San Diego, CA (US); James Y. Hurt, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 884 days.

This patent is subject to a terminal disclaimer.

(21) Appl. No.: 10/959,516

(22) Filed: Oct. 5, 2004

(65) Prior Publication Data
US 2005/0201448 A1    Sep. 15, 2005

Related U.S. Application Data

(63) Continuation of application No. 09/676,346, filed on Sep. 29, 2000, now Pat. No. 6,847,677.

(51) Int. Cl.
*H04B 1/00* (2006.01)
(52) U.S. Cl. ...................................................... 375/146
(58) Field of Classification Search .................. 375/130, 375/135, 140, 146, 148; 370/328, 342, 208–209
See application file for complete search history.

(56) References Cited

U.S. PATENT DOCUMENTS 5,101,501 A    3/1992   Gilhousen
(Continued)

FOREIGN PATENT DOCUMENTS

WO          0163813          8/2001
(Continued)

OTHER PUBLICATIONS

International Search Report PCT/US01/030417, International Search Authority European Patent Office Jun. 3, 2002.
(Continued)

*Primary Examiner* — Jean B Corrielus
(74) *Attorney, Agent, or Firm* — Jeffrey D. Jacobs

(57) ABSTRACT

A method and apparatus is provided for efficient processing of signal in a communication system. The processing of the signal for transmission may include encoding a block of data at an encoding rate 1/R. The encoding produces R number of data symbols for every data bit in the block of data. A block of RAM (299, 600) is partitioned into a plurality of blocks of RAM to allow reading simultaneously data symbols from the plurality of blocks of RAM to produce an in-phase and a quad-phase data symbols simultaneously. At least two scramblers (306 and 307) are used for simultaneously scrambling the in-phase and quad-phase data symbols. A Walsh covering/summing block (700) followed by the scramblers provides efficient Walsh covering and summing of signals for a combined transmission from the communication system.

18 Claims, 7 Drawing Sheets

U.S. PATENT DOCUMENTS

| | | | |
|---|---|---|---|
| 5,619,526 A * | 4/1997 | Kim et al. | 370/335 |
| 5,710,768 A * | 1/1998 | Ziv et al. | 370/342 |
| 5,724,383 A | 3/1998 | Gold et al. | |
| 6,185,199 B1 * | 2/2001 | Zehavi | 370/335 |
| 6,445,714 B1 * | 9/2002 | d'Anjou et al. | 370/441 |
| 6,522,683 B1 * | 2/2003 | Smee et al. | 375/144 |
| 6,895,036 B2 * | 5/2005 | Medlock | 375/142 |
| 7,280,582 B2 * | 10/2007 | Medlock | 375/142 |
| 2001/0038663 A1 * | 11/2001 | Medlock | 375/142 |
| 2002/0037029 A1 * | 3/2002 | Shimizu et al. | 375/148 |
| 2006/0018371 A1 * | 1/2006 | Medlock | 375/152 |

FOREIGN PATENT DOCUMENTS

WO    WO0227958    4/2002

OTHER PUBLICATIONS

TIA/EIA Standard, "Mobile Station-Base Station Compatibility Standard for Wideband Spread Spectrum Cellular Systems," TIA/EIA-95-B (Upgrade and Revision of TIA/EIA-95- A), pp. 1-1206 (Mar. 1999).

TIA/EIA/IS 2000 3GPP2 C.S0001-0 v1.0 Jul. 1999, Introduction to cdma2000 Standard for Spread Spectrum Systems.

* cited by examiner

METHOD AND APPARATUS FOR EFFICIENT WALSH COVERING AND SUMMING OF SIGNALS IN A COMMUNICATION SYSTEM

CLAIM OF PRIORITY UNDER 35 U.S.C. §120

The present Application for Patent is a Continuation of 09/676,346, U.S. Pat. No. 6,847,677, entitled "METHOD AND APPARATUS FOR EFFICIENT WALSH COVERING AND SUMMING OF SIGNALS IN A COMMUNICATION SYSTEM" filed Sep. 29, 2000, issued, Jan. 25, 2005, and assigned to the assignee hereof and hereby expressly incorporated by reference herein.

FIELD

The present invention relates to the field of communications. More particularly, the present invention relates to a novel and improved method and apparatus in a code division multiple access communication system for fast processing of a transmit signal.

BACKGROUND

Efficient processing of a signal for transmission from a transmitter is one of the sought after performance enhancements in communication systems, such as code division multiple access (CDMA) communication systems. Several of such CDMA communication systems are well known. One of the systems is the CDMA communication system operating based on the TIA/EIA-95 standard, commonly known as IS-95 standard, incorporated by reference herein. The IS-95 standard provides description and the operational requirements for the structure of transmit channels, such as the forward channels. The forward channels are directed from a base station to one or more mobile stations. Generally, the structure of the forward channels according to the IS-95 standard requires using binary phase shift-keying (BPSK) data modulation and binary pseudo noise (PN) spreading. The data bits after channel encoding are modulated through a BPSK modulator, and a binary PN spreading/modulator spreads the BPSK modulated data symbols by inputting one symbol at a time. The binary PN spreading in this case includes two paths for the in-phase and quadrature-phase modulations. The results of each path pass through carrier modulation. After summing the carrier modulated signals from each path, the summed results are amplified for transmission from an antenna system. Specific requirements for the IS-95 forward channel structure are described in section 7 of the IS-95 standard.

A communication system defined and operated according to the TIA/EIA/IS-2000, commonly known as the IS-2000 standard, incorporated by reference herein, also includes a forward channel structure. The IS-2000 forward channel structure is defined in section 3 of the standard. The IS-2000 system is backward compatible to the IS-95 system. On the forward channel, in addition to the requirement for BPSK modulation for IS-95 compatibility, IS-2000 systems require QPSK pre-spreading of the data symbols. For QPSK spreading/modulating, the input section of the modulator requires two data symbols at the same time, namely in-phase and quadrature-phase data symbols.

In such systems, there is a need for efficient processing of signals to save processing time and reduce cost. Additionally, there is a greater advantage to provide a method and apparatus for efficient processing of data symbols in a transmitter for transmitting forward channel signals in a CDMA communication system.

SUMMARY

The presently disclosed method and apparatus are directed for efficient processing of signals in a communication system. In-phase and quad-phase data symbols are produced after an encoding process to facilitate efficient processing of a signal. Partitioning a RAM structure facilitates production of in-phase and quad-phase data symbols simultaneously. At least two scramblers are used to receive and scramble simultaneously the in-phase and quad-phase data symbols. A Walsh covering/summing block provides efficient Walsh covering and summing of signals for a combined transmission from the communication system.

BRIEF DESCRIPTION OF THE DRAWINGS

The features, objects, and advantages of the disclosed embodiments will become more apparent from the detailed description set forth below when taken in conjunction with the drawings in which like reference characters identify correspondingly throughout and wherein.

DETAILED DESCRIPTION OF THE PREFERRED EMBODIMENT(S)

A novel and improved method and apparatus for efficient processing of signals in a communication system is described. The exemplary embodiment described herein is set forth in the context of a digital cellular telephone system. While use within this context is advantageous, different embodiments may be incorporated in different environments or configurations. In general, the various systems described herein may be formed using software-controlled processors, integrated circuits, or discrete logic. The data, instructions, commands, information, signals, symbols and chips that may be referenced throughout the application are advantageously represented by voltages, currents, electromagnetic waves, magnetic fields or particles, optical fields or particles, or a combination thereof. In addition, the blocks shown in each block diagram may represent hardware or method steps.

Figure 1:
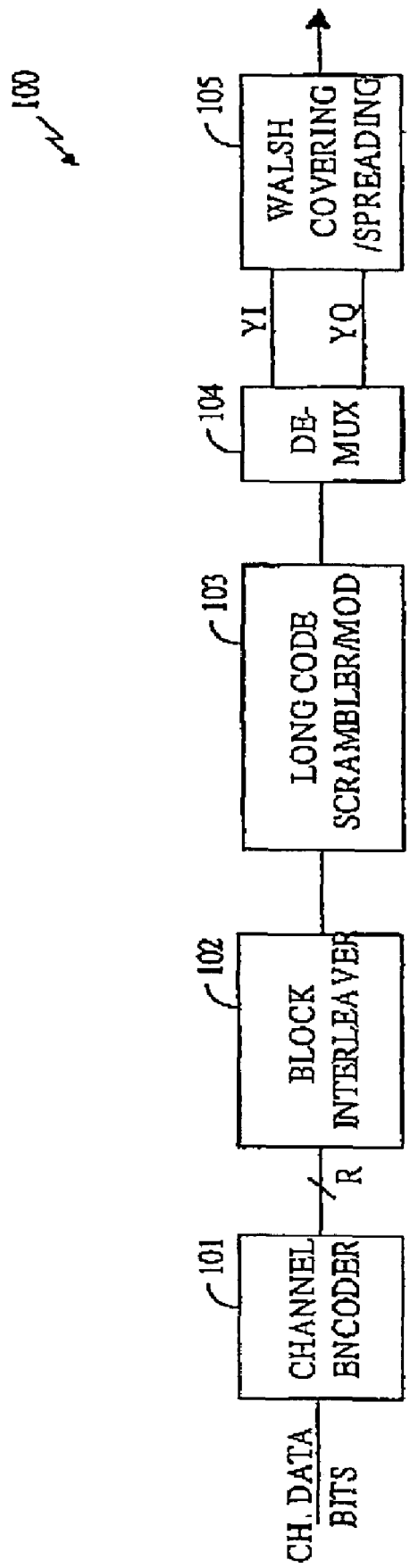
FIG. 1 illustrates various processing blocks in a communication system transmitter.

Referring to FIG. 1, a simplified block diagram of a forward channel structure 100 is shown. The forward channel structure 100 may be used in a CDMA system operating according to the IS-2000 standard. Channel data bits are input to a channel encoder 101 to produce encoded channel data symbols. The functions in channel encoder 101 may include adding frame quality bits, and performing convolutional and/or turbo encoding. Channel encoder 101 passes the channel encoded symbols to a block interleaver 102 for an interleaving function. The interleaved data symbols are input to a long code scrambling/modulator block 103 where data symbols in each channel are scrambled with a long code mask. Other functions such as a power control symbol puncturing may also take place in long code scrambling/modulator block 103. A de-multiplexer 104 de-multiplexes the output of the long code scrambling/modulator block 103 to produce data symbols for QPSK PN spreading. Since QPSK PN spreading is used, two data symbols are outputted simultaneously with each clock cycle from de-multiplexer 104. A QPSK spreading block 105 modulates and spreads the input data symbols for subsequent amplification and transmission from an antenna system (not shown).

QPSK spreading block 105 operates on at least two data symbols at its input with every clock cycle. The interleaver 102 and long code scrambling/modulator block 103 output one data symbol per clock cycle. As a result, de-multiplexer 104 may need to accumulate data symbols to output two data symbols with every clock cycle. As such, a processing "bottle neck" may be created at the input of QPSK spreading block 105 resulting in inefficient processing of a forward channel signal for transmission.

Figure 2:
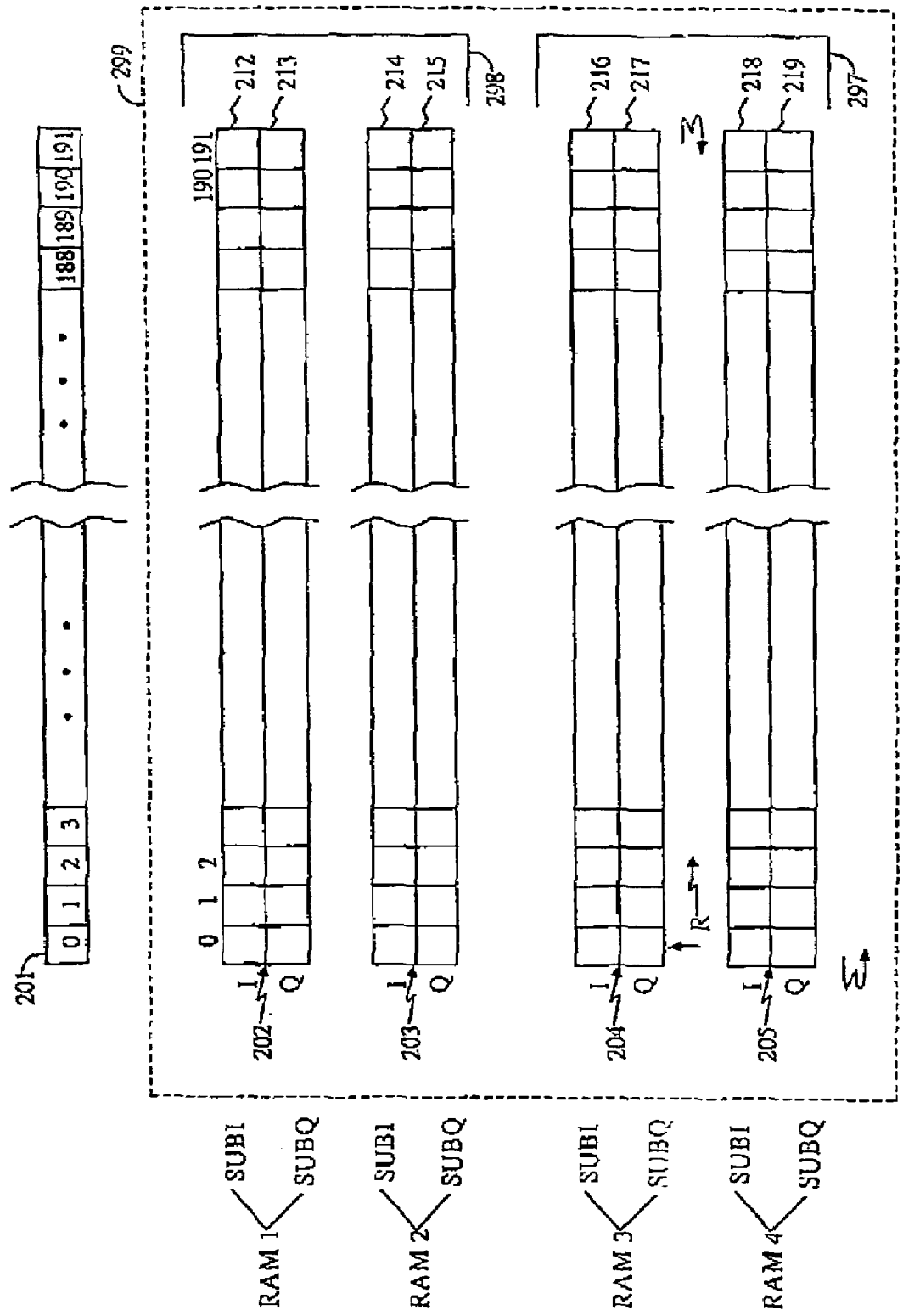
FIG. 2 illustrates a partitioned RAM structure for an interleaving operation in a transmitter of a communication system.

Referring to FIG. 2, a block of data 201 for transmission in a communication system may be encoded at an encoding rate 1/R. The encoding may be performed by channel encoder 101 as described. The encoding rate may be ½, ¼, or any other encoding rate. After encoding, R number of data symbols are produced for every encoded data bit. As a result, R number of blocks of data are produced. In case of encoding at the rate ½, two blocks of data are produced at the output of the encoder. The channel structure also may include a block interleaver, such as block interleaver 102. The block interleaver then receives two blocks of data, and in case of encoding rate at ¼, four blocks of data. Block interleaver 102 inputs each block of data, rearranges the position of the data symbols in the block of data according to an interleaving function while writing the data into a RAM block, and outputs the rearranged block of data from the RAM block.

To efficiently process data symbols in block interleaver 102, a block of RAM may be partitioned into two blocks of RAM 202 and 203. The data symbols of the received blocks of data are written into blocks of RAM 202 and 203. The order of writing the data symbols and their respective locations in the RAM blocks 202 and 203 may be according to a pre-defined interleaving function. An exemplary interleaving function may be found in the IS-2000 or IS-95 standard. To output interleaved data symbols, the data symbols from each block of data are sequentially read. The sequential reading begins at a first RAM block of the two blocks of RAM 202 and 203. The sequential reading continues to a second RAM block of the two blocks of RAM 202 and 203. The sequential reading ends at the second RAM block of the two blocks of RAM 202 and 203. The first and second RAM blocks may be respectively RAM blocks 202 and 203.

Reading and writing functions may be performed simultaneously for a first and second blocks of data respectively associated with a first and second frames of data. The writing function is associated with the first frame of data while the reading is associated with the second frame of data. The second frame of data being in advance of the first frame of data for transmission from the communication system. The reading and writing functions are taking place simultaneously in respectively two sets of blocks of RAM. Each set includes two blocks of RAM. A first set 298 may include RAM blocks 202 and 203, and a second set 297 may include RAM blocks 204 and 205. The data symbols in the second set have been written prior to writing data symbols in the first set. By keeping two sets, the writing and reading functions may be alternated between the first and second sets. As such, simultaneous writing and reading functions may take place at all times.

Each block of RAM, such as any of RAM blocks 202-05, may be partitioned to include at least a pair of sub-blocks of RAM. The sub-blocks of RAM are shown as sub-blocks 212-13 for RAM block 202, 214-15 for RAM block 203, 216-17 for RAM block 204, and 218-19 for RAM block 205. One of the sub-blocks of RAM in each pair stores in-phase data symbols, and another quad-phase data symbols. The in-phase and quad-phase data symbols are stored in respective sub-blocks. The location for each data symbol is determined according to the interleaving function. The sequential reading of the data symbols may include reading the RAM sub-blocks simultaneously. As a result, at each reading step, an in-phase data symbol and a quad-phase data symbol are produced simultaneously with each clock cycle. For example, referring to RAM block 204, the read function allows reading data bits at each RAM location from both sub-blocks 216 and 217. Since in-phase and quad-phase data symbols are stored in respectively sub-blocks 216 and 217, in-phase and quad-phase data symbols are read and produced simultaneously.

Producing an in-phase data symbol and a quad-phase data symbol at the same time with one clock cycle is beneficial and efficient for a QPSK spreader, which requires an in-phase data symbol and a quad-phase data symbol at its input, and is in a chain of signal processing blocks in a transmitter of the communication system. When the data symbols are processed two at a time for the QPSK spreader, a processing "bottle neck" as described may not be created. As a result, the signal processing of the signal is performed more efficiently in the transmitter.

Figure 3:
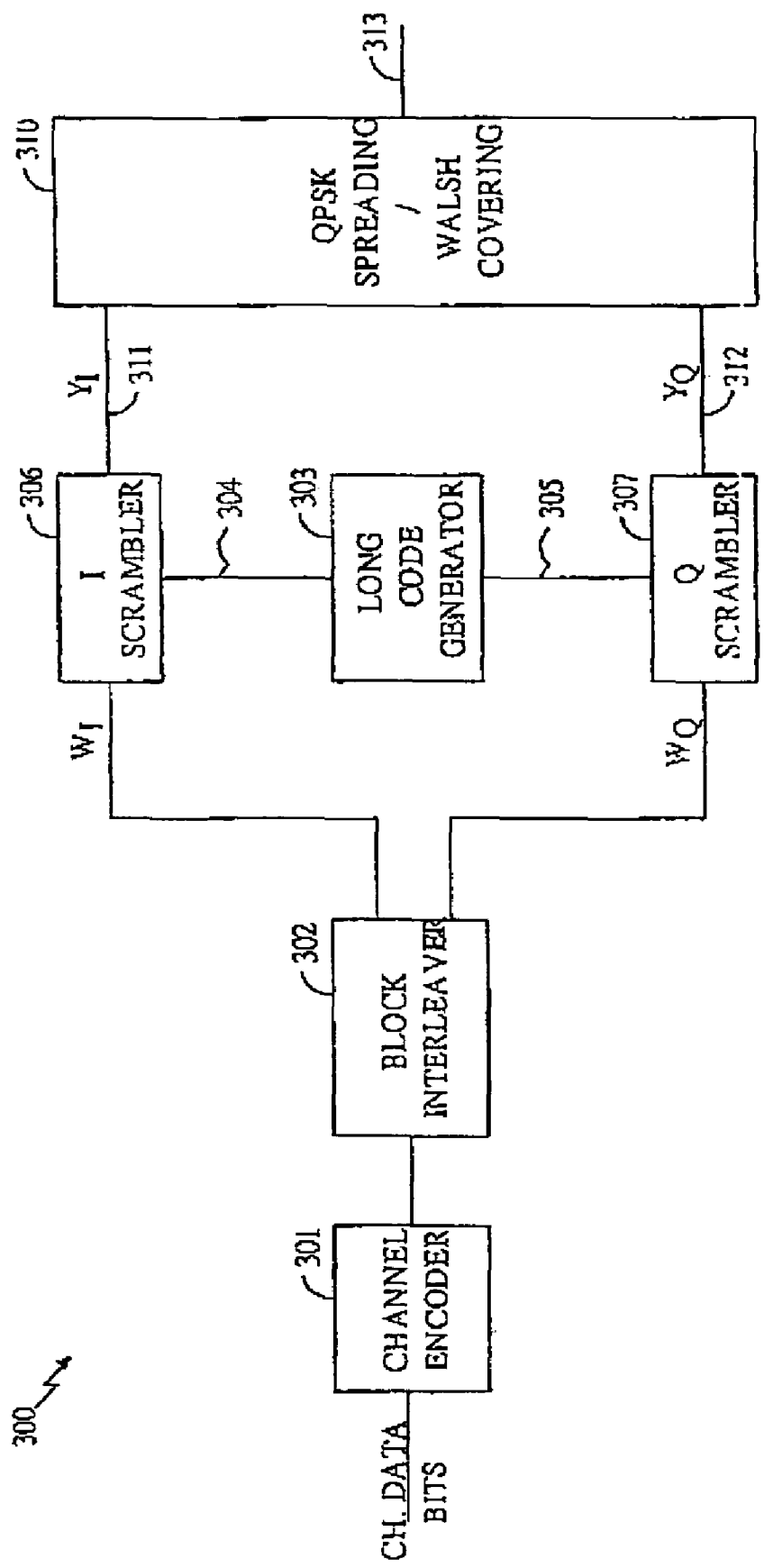
FIG. 3 illustrates various processing blocks in a communication system transmitter which includes at least two scramblers.

Referring to FIG. 3, an exemplary block diagram of a transmitter 300 for processing signal is shown. Transmitter 300 may be suitable for transmitting CDMA signals, such as froward channel CDMA signals. Transmitter 300 includes a channel encoder 301 for encoding channel data. An example of such an encoder for various channels has been described in the IS-2000 standard and other similar standards such as the WCDMA standard. Channel encoder 301 may perform convolutional encoding, turbo encoding symbol adding, and repetition. Input data bits are encoded to produce encoded data symbols. The terms data bit and data symbol are interchangeable in some respect. One data symbol depending on the modulation and encoding scheme may be represented by several data bits. Encoder 301 depending on the encoding rate produces multiple data symbols for every input data bit. Several encoding rates may be possible. For example, encoding rate ½, ¼, ⅓ and ⅙ are all possible in the system operating according to the IS-2000 standard. In case of encoding at rate ½, two data symbols are produced for every input data bit, and in case of encoding at rate ¼, four data symbols are produced. As such, when a block of data such as data block 201 inputs encoder 301, two blocks of data are produced for encoding at rate ½, and four blocks of data in case of encoding at rate ¼.

Encoded data symbols pass through a block interleaver 302 for a data block interleaving. Basic operations of an interleaver are well known in the art. Data symbols inputted to interleaver 302 are rearranged according to an interleaver function. The interleaved data symbols are outputted. For a QPSK spreader 310 in a chain of signal processing blocks in transmitter 300, producing an in-phase data symbol and a quad-phase data symbol at the same time with one clock cycle at the output of interleaver 302 is beneficial and efficient. When multiple data symbols are processed simultaneously, for example an in-phase data symbol and a quad-phase data symbol for the QPSK spreader, a processing "bottle neck" may not be created. The process described for RAM blocks 202-03 and/or 204-05 may be used to generate the in-phase and quad-phase data symbols simultaneously. As such, interleaver 302 may include a similar RAM structure.

Before QPSK spreading, encoded data symbols may need to be scrambled according to a long code assigned to each channel and/or a user of the channel. Operation of a long code scrambler is well known and described in the IS-2000 standard, as an example. Long code scrambling of data symbols involves generating a long code. A long code generator 303 may be necessary to perform long code generation. Since block interleaver 302 produces an in-phase data symbol and a quad-phase data symbol at the same time, long code generator 303 provides two long code bit streams 304 and 305 at the same time. Long code stream 304 may be used for scrambling in-phase data symbols in an I-scrambler 306, and long code stream 305 for scrambling quad-phase data symbols in a Q-scrambler 307. The in-phase and quad-phase data symbols are passed to respectively I-scrambler 306 and Q-scrambler 307 for data scrambling operations to produce scrambled in-phase and quad-phase data symbols 311 and 312 respectively.

A difference between the I and Q scrambling operations may be in the long code streams used for the scrambling operations. The long code streams 304 and 305 are generated by long code generator 303 at different tap outputs. An I mask and a Q mask may be used to generate, respectively, long code streams 304 and 305. Long code stream 305 may be in advance of long code stream 304 by a fixed or variable number of codes according to the masks being used. For example, long code stream 304 may be in advance of long code stream 305 by 64 code symbols. Long code generator 303 internally generates a long code consisting of a stream of code symbols. The stream of code symbols is tapped at two different points, for example 64 symbols apart, to provide long code streams 304 and 305. The in-phase data symbols are scrambled in I-scrambler 306 via long code stream 304, and quad-phase data symbols are scrambled in Q-scrambler 307 via long code stream 305. Scrambled in-phase and quad-phase data symbols 311 and 312 are produced simultenously. Scrambled in-phase and quad-phase data symbols are simultenously passed to QPSK spreader 310 for spreading according to a QPSK spreading scheme. As such, processing a signal for transmission in transmitter 300 is peformed efficiently.

The operations in spreader 310 may include Walsh cover operation before QPSK spreading. Each user or channel may have its unique Walsh cover. The operation of Walsh cover is well known, and one or more examples have been described in the IS-2000 standard. After QPSK spreading, the resulting signal passes through carrier modulation to produce a spread spectrum signal 313 for transmission from the communication system.

The efficiency of processing a transmit signal, moreover, is improved when data symbols for one frame is being read while data for another frame is being written in interleaver block 302. To facilitate writing data symbols for one frame of data and reading for another frame of data, block interleaver 302 may include a block of RAM 299, shown in FIG. 2. RAM block 299 may be partitioned into two sets of blocks of RAM 297 and 298. Each set may include two blocks of RAM. In case of RAM set 298, RAM blocks 202 and 203 are shown, and in case of set 297, RAM blocks 204 and 205 are shown. RAM blocks 202-05 may be considered to be parts of the larger RAM block 299. For writing data symbols of the first frame of data, data symbols are written into a first set of the two sets of blocks of RAM 297 and 298. The writing may be according to a predefined interleaving function. For reading data symbols of the second frame of data, data symbols are read sequentially from a second set of the two sets of blocks of RAM 297 and 298. The first set at one time may be the set 298, and another time set 297. Similarly, the second set may be at one time the set 297 and another time set 298. As such, while the data is being written in one set, the data is being read from the other set.

The reading operation is performed sequentially at each RAM location. For example in RAM set 297, the sequential reading begins at a first RAM block, for example RAM block 204, of the two blocks of RAM 204 and 205, and continues to a second RAM block, for example 205, of the two blocks of RAM of 204 and 205. The sequential reading ends at the second RAM block 205 of the two blocks of RAM 204 and 205 of RAM set 297. In RAM block 299, each block of RAM is partitioned to at least two sub-blocks of RAM for storing in-phase data symbols and quad-phase data symbols. At each reading step, two data symbols are read, one being the in-phase and another quad-phase. Two RAM sub-blocks are read simultaneously at each of the sequential reading step, to produce an in-phase data symbol and a quad-phase data symbol simultaneously. The in-phase data symbol and quad-phase data symbol are simultaneously input, respectively, to I-scrambler 306 and Q-scrambler 307, which improves the efficiency of processing the transmit signal.

The RAM structure 299 may include a write pointer, not shown for simplicity, for writing data symbols into a first set of two sets 297 and 298 of blocks of RAM. Operation of a write pointer in the context of a RAM structure is well known in the art. The write pointer may be programmed to write the input data symbols according to a predefined interleaving function used in block interleaver 302. In addition, RAM structure 299 may include a read pointer for sequentially reading data bits. If the reading operation, for example, is taking place for the set 297, the read pointer sequentially begins reading at RAM block 204, and continues to RAM block 205. The read pointer ends reading data symbols at RAM 205. Each block of RAM in the two blocks of RAM in sets 297 and 298 includes at least two sub-blocks of RAM. Via the write pointer, one of the two sub-blocks of RAM stores in-phase data symbols, and another quad-phase data symbols. Via the read pointer, the two RAM sub-blocks are read simultaneously at each of the sequential reading to produce an in-phase data symbol and a quad-phase data symbol simultaneously.

Figure 4:
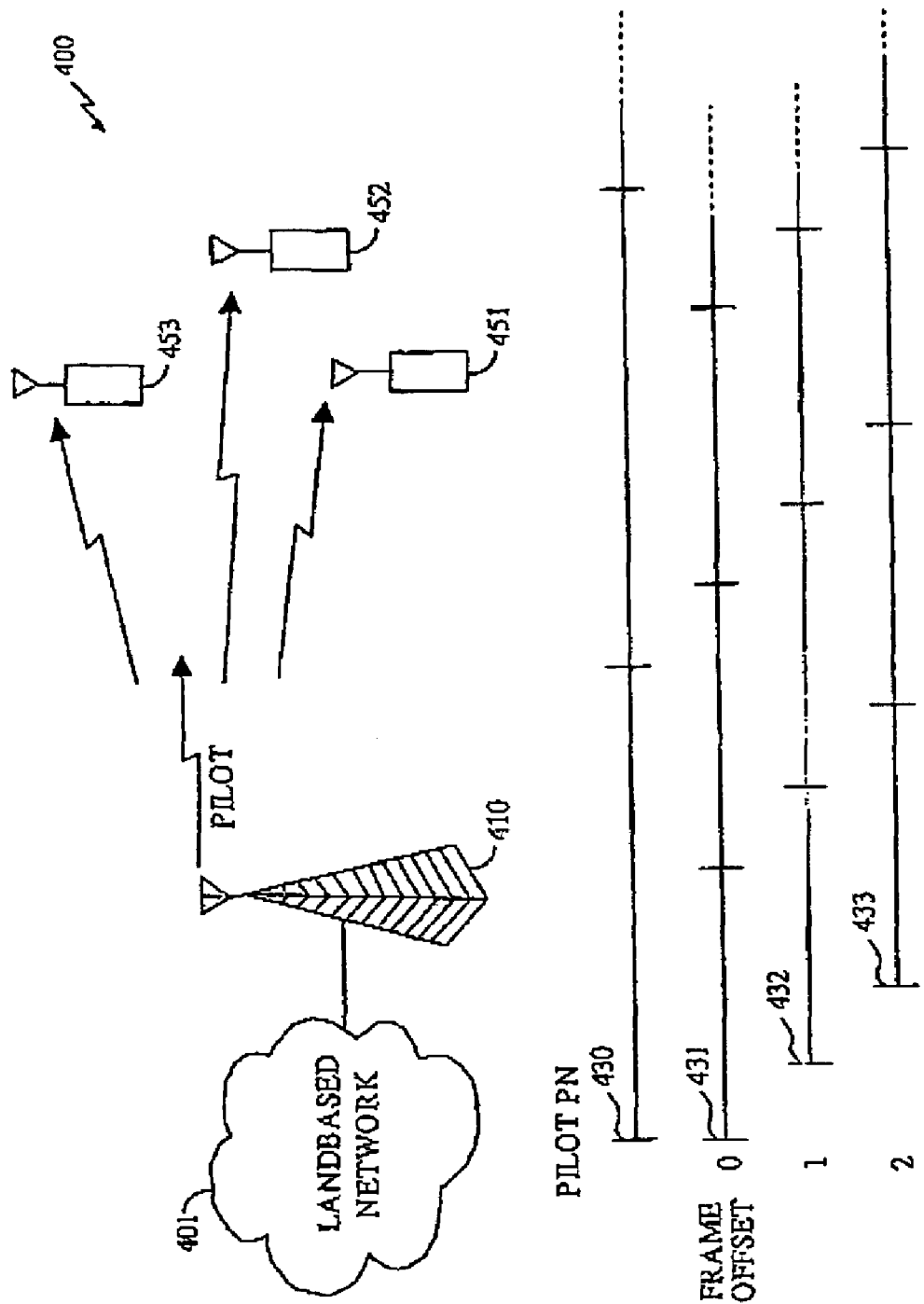
FIG. 4 illustrates a general block diagram of a communication system.

Referring to FIG. 4, a block diagram of an exemplary communication system 400 is shown. Communication system 400 may include a base station 410 connected to a land-based network 401. Land-based network 401 provides land-based connections, such as land-based telephone connections and data network connections, to users of communication system 400. Base station 410 may also be connected to other base stations (not shown for simplicity.) The wireless users of communication system 400 may be a number of mobile stations, such as mobile stations 451-53. Although only three mobile stations are shown, any number of mobile stations in the communication system 400 may be possible depending on the system capacity. The mobile stations maintain communication links with base station 410 for receiving and transmitting information, such as voice information and data information. The communication link between base station 410 and each mobile station may include a forward link from the base station to the mobile stations, and a reverse link from each mobile station to the base station. Various configurations of the reverse and forward links have been described in the IS-95, IS-2000, and W-CDMA standards. Base station 410 may incorporate transmitter 300 for transmission of the forward link signals.

On the forward link, the channel data bits are passed on to channel encoder 301. The channel data may be generated by land-based network 401 or other possible sources. Channel data for more than one destination user may be generated and passed on to channel encoder 301. Encoded data symbols are passed to block interleaver 302 which interleaves the data symbols for each channel according to an interleaving function. Since channel encoder 301 may encode channel data bits for more than one channel, block interleaver 302 may receive encoded data symbols associated with one or more channels on the forward link communications. Interleaved data symbols pass through a long code scrambling operation as disclosed. Each channel may be assigned a long code. The interleaved data symbols for each channel pass through an associated long scrambling operation on the forward link. The long scrambled data symbols for each channel are passed on to QPSK spreading 310 to form a combined forward link signal. In particular, beneficial aspects of various disclosed embodiments are more apparent in the application of the forward link. As such, block interleaver 302 may be configured according to various disclosed embodiments for efficient processing of signals in the forward link direction when several forward link channels are being combined in the forward link signal.

Figure 5:
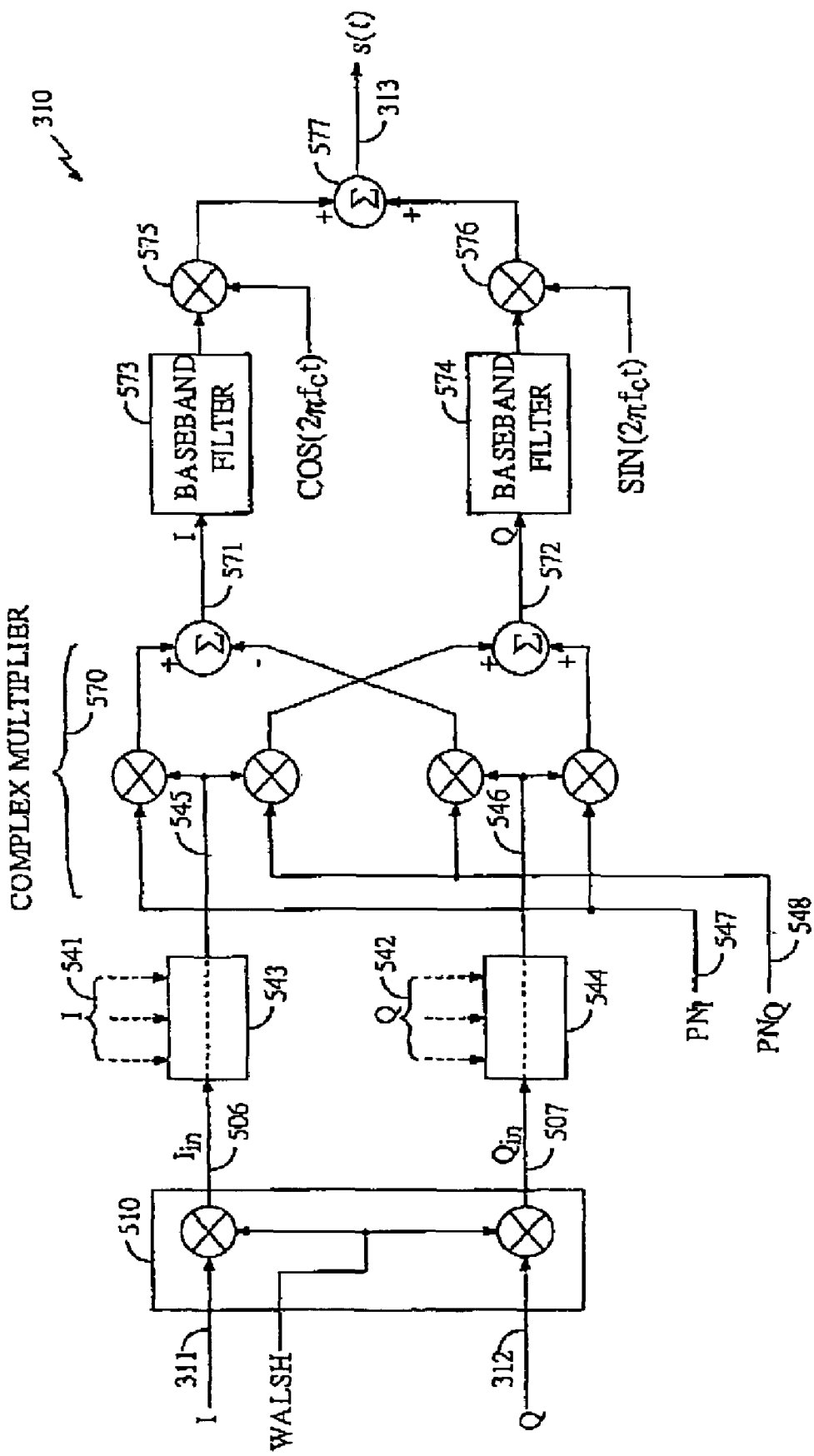
FIG. 5 illustrates Walsh covering, summing, PN spreading and carrier modulation blocks of a transmitter.

Referring to FIG. 5, a block diagram of QPSK spreader 310 is shown. Operations of QPSK spreader 310 as shown include the Walsh cover operation, summing operation for summing the signals of each forward link channel, complex multiplier operation, base band filtering operation, and carrier modulation operation to produce signal 313 for amplification and transmission from base station 410 to mobile stations in the coverage area. QPSK spreader 310 may include more or less operations in a variety of configurations. A Walsh code normally is assigned to each channel in the forward link direction. After long code scrambling, the resulting I and Q signals pass through a Walsh cover operation. The Walsh cover operation for a channel is shown in a Walsh cover block 510. Walsh cover operation in block 510 includes multiplying the input I and Q signals 311 and 312 by the assigned Walsh function to produce Walsh covered I and Q signals 506 and 507.

If there are other channels to be combined on the forward link, I and Q signals 541 and 542 of other channels, after being Walsh covered by respective Walsh codes, like the Walsh cover operation in Walsh cover block 510, are inputs to summing blocks 543 and 544. Before Walsh cover operation, I signals 541 and Q signals 542 are passed through encoding and block interleaving operations, and long code scrambling operations similar to the long code scrambling operations shown for I signal 311 and Q signal 312. After the Walsh cover operations, I signals 506 and 541 are summed in summing block 543, and Q signals 507 and 544 in summing block 542. The results are combined I-signal 545, and combined Q-signal 546.

The next operation in QPSK spreader 310 includes a complex multiplier operation 570 via PNI sequence 547 and PNQ sequence 548. PNI and PNQ sequences 547 and 548 are I and Q channels PN sequences. The combined I and Q signals 545 and 546 are complex multiplied by PNI and PNQ sequences 547 and 548. The complex multiplier operation 570 includes spreading signals 545 and 546 to produce I and Q signals 571 and 572. Base band filters 573 and 574 may be used to filter I and Q signals 571 and 572. To carrier modulate I and Q signals 571 and 572 after filtering, multipliers 575 and 576 are used. The resulting signals are combined in a combiner 577 to produce combined signal 313. Signal 313 is amplified for transmission from one or more antennas at base station 410.

Figure 6:
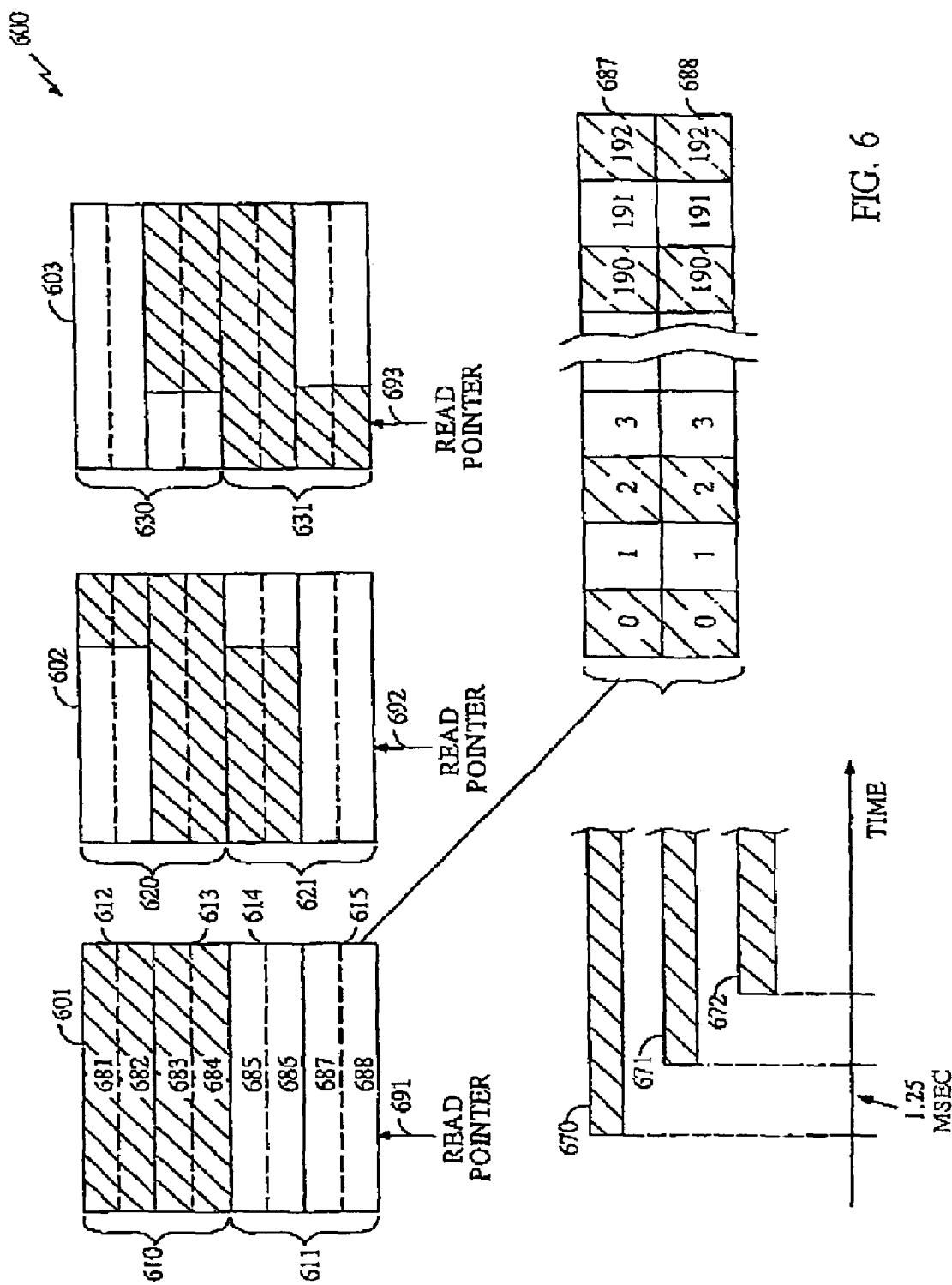
FIG. 6 illustrates a partitioned RAM structure for interleaving operations of several channels in a transmitter of a communication system.

Referring to FIG. 6, to provide efficient interleaving operations associated with one or more forward channels which are combined on a forward link signal, a RAM structure 600 is partitioned into a plurality of blocks of RAM, such as blocks of RAM 601-03. Although only three partitioned blocks are shown, other number of partitioned RAM blocks is also possible. Each of blocks of RAM 601-03 is partitioned into two sets of blocks of RAM. For example, RAM block 601 is partitioned into two sets of blocks of RAM 610 and 611, similarly for RAM block 602, sets 620 and 621, and for RAM block 603, sets 630 and 631. Moreover, each set includes two blocks of RAM. For example in case of set 610, blocks of RAM 612 and 613, and set 611, blocks of RAM 614 and 615.

RAM blocks 601, 602 and 603 are each associated with a channel in the forward link. Each of the plurality of blocks of RAM 601-03 holds data associated with a channel. For storing data, data symbols are written into a first set of the two sets of blocks of RAM. The first set, in case of RAM block 601, may be at one time set 610, and at another time set 611. Writing data is according to a predefined interleaving function. To read the data for each of the plurality of blocks of RAM 601-603, a read pointer sequentially reads data symbols from a second set of the two sets of blocks of RAM. The second set, in case of RAM block 601, may be at one time set 610, and at another time set 611. When writing data is taking place in the first set, reading data may take place in the second set. Writing data in each of the plurality of blocks of RAM 601-03 may take place at the same time. Moreover, reading data from each of the plurality of blocks of RAM 601-03 may take place at the same time.

Sequential reading for each of the plurality of blocks of RAM 601-03 begins at a first RAM block of the second set. For example, if the second set is set 611, the sequential reading of data begins at RAM block 614. The sequential reading continues to a second RAM block of the second set, namely, according to the example, RAM block 615. The sequential reading ends at the second RAM block of the second set, namely, according to the example, RAM block 615.

For each of the plurality of blocks of RAM 601-03, each block of the two blocks of RAM in each set is partitioned to at least two sub-blocks of RAM. One of the two sub-blocks of RAM via the writing process stores in-phase data symbols, and another quad-phase data symbols. The RAM sub-blocks are read simultaneously at each step of the sequential reading to produce an in-phase symbol and a quad-phase data symbol simultaneously. As such, while reading data from the plurality of blocks of RAM 601-03, in-phase and quad-phase data symbols are produced at the same from each block of RAM. Therefore, in-phase and quad-phase data symbols associated with three forward channels corresponding to the plurality of blocks of RAM 601-03 are produced at the same time. Producing the data symbols at the same time improving the efficiency of processing the transmit signals.

Each set of RAM holds data bits for one frame of data. For example, RAM set 610 consisting of RAM blocks 612 and 613 holds data for filling one frame of data. Since RAM blocks 601, 602 and 603 are each associated with a channel in the forward link, each block holds data, which are stored and read, for each channel. For example, for each channel, while data is being written in set 610, data are being read from set 611. Similarly for other channels in other RAM blocks, while data are being written in one set in a RAM block, data are being read from the other set in the same RAM block.

Each frame of data in each channel has a fixed number of data bits. As such, the read operation of RAM blocks 601, 602 and 603 may be simplified. For example, if a read pointer 691 is reading data from a RAM location in RAM set 611, a read pointer 692 would be pointing to another RAM location in set 621. The read pointer 692 at all times would be in a fixed relation with respect to the location of read pointer 691. For example, if the read pointer 691 is pointing to the first RAM location in set 611, read pointer 692 is pointing to the first RAM location in set 621. The fixed offset between the read pointers 691 and 692 would be equal to the size of a RAM block, such as RAM blocks 601 and 602. Since RAM structure 600 is partitioned into a plurality of blocks of RAM, such as blocks of RAM 601-03, each having equal number of RAM locations, the offset between other read pointers would also remain the same. Therefore, the read operations for all blocks would use one read offset for all read pointers such as read pointers 691-93. As such, reading data from the RAM blocks 601-03 may be simplified by having minimal processing for calculation of read pointer locations for each block of RAM.

RAM structure 600 may be partitioned into any number of blocks of RAM, each having equal number of RAM locations. The number of blocks of RAM in RAM structure 600 may be equal to the number of channels being processed by an integrated circuit handling channel interleaving operations in the system. For simplicity, three blocks of RAM 601, 602, and 603 are shown corresponding to three different channels, although other number of blocks of RAM corresponding to equal number of channels is possible. The three read pointers 691, 692, and 693 are corresponding to three different channels. To handle processing of block interleaving for all three channels, read pointers 692 and 693 are set in fixed increments from read pointers 691. As a result, controlling the operation of RAM structure 600 needs only to handle one read pointer with multiple fixed offsets. Such a simplification allows efficient processing of interleaving operations in a multi-channel system.

Referring to FIG. 4 again, base station 410 may also transmit a pilot channel to be received by all mobile stations in the coverage area. Operations of a pilot channel are well known and have been described in IS-95, IS-2000, and WCDMA standards. Pilot channel is transmitted to the mobile stations to assist the mobile stations in determining the characteristics of the propagation channel. The pilot channel information is used in decoding other channels such as traffic channels, paging channels, and other control channels. The frame timing of each forward link channel may be staggered with respect to a frame timing measured from the pilot channel PN sequence. This is commonly referred to as frame offset. Frame offset is performed to prevent possible large power fluctuations in the forward link signal. Although several forward link channels may have common frame offset, other forward link channels may be assigned to a different frame offset. Pilot channel PN sequence 430 may be repeated every 26.6 mSec. The forward link frame offset is measured from the beginning of pilot channel PN sequence 430. For frame time offset 431 (frame offset "0"), the beginning of the frame coincides with the beginning of pilot channel PN sequence 430. For frame time offset 432 (frame offset "1"), the beginning of the frame is in time offset from the beginning of pilot channel PN sequence 430 by a predetermined number of chips, possibly, equal to 1.25 mSec. For frame time offset 433 (frame offset "2"), the beginning of the frame is in time offset from the beginning of the pilot channel PN sequence 430 by a predetermined number of chips, possibly, equal to two times 1.25 mSec, i.e. 2.5 mSec. One frame of forward link may be equal to 20 mSec. Therefore, there may be as many as 16 possible frame time offsets, each time offset being equal 1.25 mSec from the next immediate time offset, before the beginning of a frame offset coinciding with the beginning of another frame offset. More than one channel may use the same frame offset.

Pilot channel PN sequence 430 may be repeated every 26.6 mSec. The forward link frame offset is measured from the beginning of pilot channel PN sequence 430. For frame time offset 431 (frame offset "0"), the beginning of the frame coincides with the beginning of pilot channel PN sequence 430. For frame time offset 432 (frame offset "1"), the beginning of the frame is in time offset from the beginning of pilot channel PN sequence 430 by a predetermined number of chips, possibly, equal to 1.25 mSec. For frame time offset 433 (frame offset "2"), the beginning of the frame is in time offset from the beginning of pilot channel PN sequence 430 by a predetermined number of chips, possibly, equal to two times 1.25 mSec, i.e. 2.5 mSec. One frame of forward link may be equal to 20 mSec. Therefore, there may be as many as 16 possible frame time offsets, each time offset being equal 1.25 mSec from the next immediate time offset, before the beginning of a frame offset coinciding with the beginning of another frame offset. More than one channel may use the same frame offset.

RAM blocks 601-03 may be associated with correspondingly three different channels. The channels may use different frame offsets, for example frame offsets 431-33. The channels corresponding to RAM blocks 601-03 may have, respectively, frame offsets 0, 1 and 2. As such, writing data in each block is shifted according to the time offsets. To illustrate, while referring to FIG. 6, RAM blocks 601-03 are shown with shaded portions. The shaded portions indicate the RAM locations where data are possibly being written at a given time. For example, in RAM block 601, the shaded portions occupy RAM 612 and 613, beginning at RAM 612 and ending at RAM 613. If the channel associated with block of RAM 602 is in time offset "1", and time offset "1" is in time offset by 1.25 mSec, the beginning of the shaded portion in block of RAM 602 is shifted by a number of RAM locations equal to a number of data symbols that may occupy 1.25 mSec of a frame of data. The shaded portion correspondingly is shifted from set 620 into set 621 by the same amount. If the channel associated with block of RAM 603 is in time offset "2" and time offset "2" is in time offset by two times 1.25 mSec (2.5 mSec.), the beginning of the shaded portion in block of RAM 603 is shifted by a number of RAM locations equal to a number of data symbols that may occupy 2.5 mSec of a frame of data.

Since read pointers 691-93 are kept pointing to the same respective locations in each block of RAM, the data output for each respective channel is consequently shifted in time in an amount equal to the frame time offset. This may be illustrated by referring to timing of data frames 670-72. Frame of data 670 having frame offset "0" may be the frame of data read from RAM block 601. Frame of data 671 having frame offset "1" may be the frame of data read from RAM block 602. Note that the beginning of the frame is in time offset by an amount equal to 1.25 mSec. Frame of data 672 having frame offset "2" may be the frame of data read from RAM block 603. Note that the beginning of the frame is in time offset by an amount equal to 2.5 mSec. As such, when the data are written in the RAM blocks with corresponding frame offsets, reading data for data frames having different frame offsets is simplified.

For data frame 670 having frame offset "0", sequential reading of data begins at RAM block 614, continues to RAM block 615, and ends at RAM block 615. For data frame 671 having frame offset "1", sequential reading begins in set 621 but a number of data symbols equal to the time offset are either ignored or discarded. The sequential reading for data frame 671 continues in set 620. The sequential reading may end in set 621. The number of data symbols read from set 621 is equal to the number of data symbols that were discarded or ignored in set 620. For data frame 672 having frame offset "2", sequential reading begins in set 631 but a number of data symbols equal to the time offset are either ignored or discarded. The sequential reading for data frame 672 continues in set 630. The sequential reading may end in set 631. The number of data symbols read from set 631 is equal to the number of data symbols that were discarded or ignored in set 630.

For transmission of a frame of data, such as data frame 201, the data frame may pass through an encoding process in channel encoder 301 before the interleaving operation in block interleaver 302. Different encoding rates are possible. For example, for encoding rates ½ and ¼, respectively two and four data symbols are produced for every data bit at the input. Either BPSK or QPSK spreading follows the interleaving operation. For BPSK spreading, as it is well known, the Q-leg of the spreading operation is prefixed to zero. The IS-95 standard describes the requirements for the BPSK spreading. This may also be the situation in radio configurations 1 and 2 as shown and described in the IS-2000 standard. The radio configurations 1 and 2 are provided in the IS-2000 standard as a part of backward compatibility with IS-95 standard. Radio configurations 3-9 as described in IS-2000 standard require QPSK spreading. As a result, a communication system operating according to IS-2000 standard may be required to have BPSK and QPSK spreadings. In order to have an efficient signal processing, the RAM structure 600 may need to have capacity to handle interface with both BPSK and QPSK spreadings.

The size of each block of RAM in RAM structure 600 is set to 8 rows of RAM. The first four rows are allocated to the first set, and the last four to the second set. From the description provided for efficient processing of transmit signals, the data are being written in the first set, while data are being read from the second set. For example, block of RAM 601 is divided into rows 681-688. The first four rows 681-684 forms the first set, set 610, and the last four rows 685-88 forms the second set, set 611. Each row would be long enough to hold data bits included in one data frame 201. Each row may be set to hold 192 data symbols. Each row may be considered a sub-block. Each row holds either in-phase data symbols or quad-phase data symbols.

For BPSK spreading following the interleaver operation, the row assigned to hold the quad-phase data symbols is filled with data symbols all equal to zero. As such, when the data symbols are read for BPSK spreading, the quad-phase data symbols having all zero value are used to effect a BPSK spreading. For example, sub-block 687 may store in-phase data symbols, and sub-block 688 may hold quad-phase data symbols. In case of BPSK spreading, the data symbols stored in sub-block 688 may be all zeros, or the data symbols stored may be ignored and a zero is substituted in the reading operation. The configuration of the forward channels according to the radio configurations 1 and 2 based on the IS-2000 standard requires channel encoding at a rate of ½ with BPSK spreading. In this case, encoding of data bits of a frame of data produces data symbols equal to two frames of data, which would fill two sub-blocks. For example, if set 610 is being used to write the interleaved data symbols, sub-blocks 681 and 683 are needed. The sub-blocks 682 and 684 are filled with zeros, or the stored value may be ignored during the reading operation and zero value is substituted.

In radio configurations 3 and 5, the encoding rate is ¼ with QPSK spreading. Therefore, the encoder produces data symbols equal to four frames of data for one frame of data at the input. In this case, if, for example, set 610 is being used for writing the interleaved data, all the RAM locations in sub-blocks 681-84 are needed to store all the interleaved data. The in-phase data symbols are written in sub-blocks 681 and 683, and the quad-phase data symbols in sub-blocks 682 and 684.

In radio configuration 4, the encoding rate is ½, and QPSK spreading is used. In this case, the encoder produces data symbols equal to two frames of data for each frame of data at the input. Since each set includes four rows of RAM, the encoded data produced in radio configuration 4 are written in four rows of RAM while skipping at least some of the RAM locations. For example, using rows 687 and 688, the encoded data are written in RAM locations 0, 2, 4, ... 190, 192, while skipping RAM locations 1, 3, ..., 191. During the reading operations, RAM locations 1, 3, ..., 191 are ignored. For the QPSK operation, the RAM locations 0, 2, 4, ... 190, 192 in rows 687 and 688 are read simultaneously for respectively the in-phase and quad-phase data symbols. As such, the processing for calculations of the read pointer locations for different radio configurations is simplified.

It is also advantageous to provide efficient transmit signal processing for the Walsh covering operations and the summing operations. Data symbols for each channel pass through a Walsh cover operation to produce Walsh covered data symbols. Walsh cover operation includes multiplying the data symbol with a Walsh symbol. One Walsh symbol may be a number of chips, such as 64 chips. Therefore, sixty four chips are produced for every data symbol. The in-phase data symbols and quad-phase data symbols are passed through independent Walsh covering operations as shown at block 510. Walsh covered data symbols of different channels are summed to form a summed signal for transmission of a forward link signal that includes more than one forward channel. The summing operations for in-phase and quad-phase data Walsh covered symbols are shown at blocks 543 and 544. As such, it is advantageous to provide efficient Walsh covering and summing operations.

Figure 7:
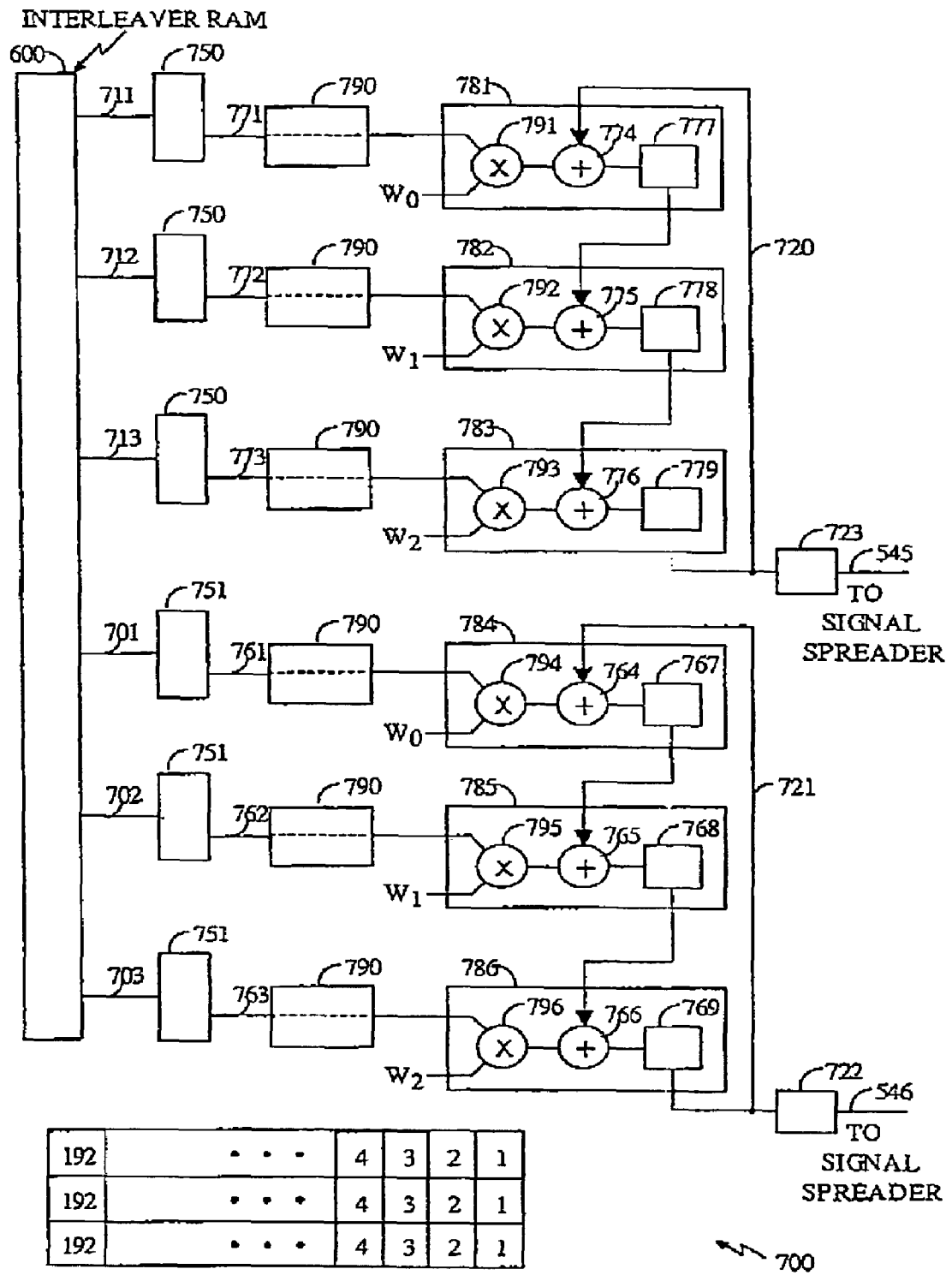
FIG. 7 illustrates scrambling, Walsh covering, and summing blocks for several channels in a transmitter.

Referring to FIG. 7, a block diagram of a processing block 700 is shown for producing combined Walsh covered signals 545 and 546. The operations are the same for producing signals 545 and 546. Signal 545 is represented as the I-signal, and signal 546 as the Q-signal. RAM block 600 produces at the same time the in-phase and quad-phase data symbols for each channel from RAM sets 601-03. The quad-phase data symbols are shown at 701-03, and in-phase data symbols at 711-13. Quad-phase data symbols 701-03 each pass through a long code scrambling block 751 to produce scrambled quad-phase data symbols 761-63. In-phase data symbols 711-13 each pass through a long scrambling block 750 to produce scrambled in-phase data symbols 771-73. Symbols 771 and 761 are associated with a first channel and are assigned a Walsh code W0. Symbols 772 and 762 are associated with a second channel and are assigned a Walsh code W1. Symbols 773 and 763 are associated with a third channel and are assigned a Walsh code W2. Data symbols 771-73 and 761-63 are passed to Walsh covering/combining blocks 781-86. A buffer 790 may be used to buffer the data symbols, otherwise, the data symbols are passed on directly.

Walsh covering/combining blocks 781-83 receive in-phase data symbols 771-73. In block 781, a multiplier 791 multiplies data symbol 771 with the assigned Walsh code W0. In block 782, a multiplier 792 multiplies data symbol 772 with the assigned Walsh code W1 with a delay at least equal to one chip time from the time of multiplication performed by multiplier 791. In block 783, a multiplier 793 multiplies data symbol 773 with the assigned Walsh code W2 with a delay at least equal to one chip time from the time of multiplication performed by multiplier 792. The Walsh covered data symbol in block 781 is produced one chip time ahead of the data symbol in block 782, and two chips time ahead of the data symbol in block 783. Since Walsh covered data symbol in block 781 is ready before the Walsh covered data symbol in block 782, it is passed on to a summer 775 to be summed at the same time with Walsh covered data symbol being produced in block 782. The result is stored in a buffer 778. At this point, buffer 778 holds a summed result of the first data symbols produced by blocks 781 and 782. This summed result is ready by at least one chip time before Walsh covered data symbol in block 783 is produced. The summed results from buffer 778 is passed on to a summer 776 to be summed with Walsh covered data symbol produced by a multiplier 793. The result is placed in a buffer 779. At this point, buffer 779 holds a data symbol which is the summed result of the first data symbols of the three channels associated with data symbols 711-13. The summed result from buffer 779 is passed on as the first symbol of the signal 545. Since a data block may hold 192 data symbols, the process is repeated for all other data symbols to produce Walsh covered summed data symbols for signal 545.

For example, the second data symbol entering in block 781 is processed when block 782 is processing the first data symbol. As a result, when block 782 is processing the second data symbol, block 781 has produced the second data symbol in buffer 777 and passed on to be summed with the second data symbol being produced in block 782. Similarly, when block 783 is processing the second data symbol, the Walsh covered summed second data symbol is ready and have been placed in buffer 778, which is to be passed on to summer 776 to be summed with the second Walsh covered data symbol produced by multiplier 793. The result is placed in buffer 779 to be used as the second data symbol of signal 545. The process is repeated for producing other data symbols for signal 545.

Walsh covering/combining blocks 784-86 receive quadphase data symbols 701-03. In block 784, a multiplier 794 multiplies data symbol 761 with the assigned Walsh code W0. In block 785, a multiplier 795 multiplies data symbol 762 with the assigned Walsh code W1 with a delay at least equal to one chip time from the time of multiplication performed by multiplier 794. In block 786, a multiplier 796 multiplies data symbol 763 with the assigned Walsh code W2 with a delay at least equal to one chip time from the time of multiplication performed by multiplier 795. The Walsh covered data symbol in block 784 is produced one chip time ahead of the data symbol in block 785 and two chips time ahead of data symbols in block 786. Since Walsh covered data symbol in block 784 is ready before the Walsh covered data symbol in block 785, it is passed on to a summer 765 to be summed at the same time with Walsh covered data symbol being produced in block 785. The result is stored in a buffer 768. At this point, buffer 768 holds a summed result of the first Walsh covered data symbols produced by blocks 784 and 785. This summed result is ready by at least one chip time before Walsh covered symbol in block 786 is produced. The summed results from buffer 768 is passed on to a summer 766 to be summed with Walsh covered data symbol produced by a multiplier 796. The result is placed in a buffer 769. At this point, buffer 769 holds a summed result of the first quad-phase Walsh covered summed data symbols of the three channels associated with data symbols 701-03. The summed result from buffer 769 is passed on as the first data symbol of the signal 546. Since a data block may hold 192 data symbols, the process is repeated for all other data symbols to produce Walsh covered summed data symbols for signal 546.

The second data symbol of the frame data in block 784 is processed when block 785 is processing the first data symbol. As a result, when block 785 is processing the second data symbol, block 784 has produced the second data symbol in buffer 767 and passed on to be summed with the second data symbol being produced in block 785. Similarly, when block 786 is processing the second data symbol, the Walsh covered summed second data symbol is ready and have been placed in buffer 768 which is passed on to summer 766, to be summed with the second Walsh covered data symbol produced by multiplier 796. The result is placed in a buffer 769 to be used as the second data symbol of signal 546.

The operation of block 700 may be performed by an integrated digital circuit. Use of clock cycles for operation of digital circuits is well known. As such, the data symbols at buffer 779 and 769 may be produced in at least two clock cycles. One clock cycle for each multiplication in blocks 791-96, and one clock cycle for each summing operation in summers 774-76 and 764-66. Since most digital circuits also use over sampled clock frequency, the clock frequency may be multiple times the chip rate of the Walsh chip used in the Walsh covering operations. The number of signals being combined is not limited to three signals as shown in FIG. 7. The process described for three channels may be repeated for as many channels as desired. For example, sixty four channels may be involved in the operation of block 700.

To improve the efficiency of processing a transmit signal on a forward link, the operation of the blocks 781-86 may be modified to include a feedback such as feedbacks 720 and 721. For example, if there are more than three channels to be combined on the forward link, blocks 781-86 may be repeatedly used for different channels until all channels have been combined for the forward link signals 545 and 546. When one chip is produced at buffers 779 and 769 in every two clock cycles, three chips relating to the three channels are processed. If the clock cycle is 16 times the chip rate, the process may be repeated eight times for processing a total of 24 chips. Since three blocks 781-83 for the I-channel, and three blocks 784-86 for Q-channel are shown, the processing completed in one chip time may be repeated for an additional 21 chips associated with 21 additional channels. Therefore, blocks 781-86 may be reused for processing data symbols associated with the additional channels within one chip time. As such, the three blocks 781-83 may be used for Walsh covering and summing of a total of 24 channels to produce a chip for signal 545 within a chip time. The feedback 720 is used to feedback the result of buffer 779 after every run to the top to be summed at a summer 774 with the newly arrived data symbol. The feedback process is repeated eight times to collect a data symbol at the buffer 779 which is the summed result of all 24 channels. When additional channels are added, RAM 600 produces data symbols associated with the additional channels. Similar operation is performed with feedback 721. The feedback 721 is used to feedback the result of buffer 769 after every run to the top to be summed at a summer 764 with the newly arrived data symbol. To facilitate the process, buffers 722 and 723 are used to collect the chips which may make up one data symbol before it is passed on to the signal spreader.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed:

1. A communication method, comprising:
   multiplying, in a multiplier, a first data symbol of a first block of data within Random Access Memory (RAM) associated with a first channel of a plurality of channels each having a block of data for transmission;
   multiplying a second data symbol of said first block of data within Random Access Memory (RAM) associated with said first channel and multiplying a first data symbol of a second block of data associated with a second channel of said plurality of channels; and
   combining a first multiplied data symbol of said first block of data and a first multiplied data symbol of said second block of data to produce a first multiplied-combined data symbol of said first and second channels, wherein multiplying of said first data symbol of said second channel is delayed by at least one chip time from multiplying of said first data of said first block of data.

2. The method as recited in claim 1, further comprising:
   multiplying a third data symbol of said first block of data and multiplying a second data symbol of said second block of data, essentially at the same time; and
   combining a second multiplied data symbol of said first block of data and a second multiplied data symbol of said second block of data to produce a second multiplied-combined data symbol of said first and second channels.

3. The method as recited in claim 1, wherein said plurality of channels includes more than two channels, further comprising:
   multiplying a first data symbol of a third block of data associated with a third channel; and
   feeding said first multiplied-combined data symbol to a combiner for combining with a multiplied first data symbol of said third block of data to produce a final first multiplied-combined data symbol of said first, second and third channels.

4. The method as recited in claim 1, wherein said plurality of channels includes more than three channels, further comprising:
   multiplying a first data symbol of a third block of data associated with a third channel;
   feeding said first multiplied-combined data symbol to a combiner for combining with a first multiplied data symbol of said third block of data to produce an interim final first multiplied-combined data symbol;
   multiplying a first data symbol of a fourth block of data associated with a fourth channel, wherein multiplying of said first data symbol of said fourth channel is delayed by at least one chip time from multiplying of said first data symbol of said third block of data; and
   combining a first multiplied data symbol of said fourth block of data with said interim final first multiplied-combined data symbol to produce a final first multiplied-combined data symbol of said first, second, third and fourth channels.

5. A communication apparatus for use with a plurality of channels each channel having a block of data for transmission, comprising:
   a first multiplier for multiplying a first data symbol of a first block of data associated with a first channel of the plurality of channels;
   a second multiplier for multiplying a first data symbol of a second block of data associated with a second channel; and
   a combiner that sums said first multiplied data symbol of said first block of data and said first multiplied data symbol of said second block of data to produce a first multiplied-combined data symbol, wherein multiplying of said first data symbol of said second channel in said second multiplier is delayed by at least one chip time from multiplying of said first data symbol in said first multiplier,
   a third multiplier for multiplying of a first data symbol of a third block of data associated with a third channel, and wherein said first multiplied-combined data symbol is fed to a second combiner that sums said first multiplied-combined data symbol with said multiplied first data symbol of said third block of data to produce a final first multiplied-combined data symbol.

6. A communication apparatus for use with a plurality of channels each channel having a block of data for transmission, comprising:
   a first covering/combining module comprising a first multiplier and a first combiner coupled to the first multiplier, the first multiplier multiplies data symbols associated with a first channel of the plurality of channels;
   a second covering/combining module comprising a second multiplier and a second combiner coupled to the second multiplier, the second multiplier multiplies data symbols associated with a second channel of the plurality of channels; and
   a third covering/combining module comprising a third multiplier and a third combiner coupled to the third multiplier, the third multiplier multiplies data symbols associated with a third channel of the plurality of channels;
   wherein a first data symbol associated with the first data channel is multiplied in the first multiplier and an output of said first multiplier is provided to the first combiner, a first data symbol associated with the second data channel is multiplied in the second multiplier delayed from the time of multiplying the first data symbol associated with the first channel is multiplied, combining outputs of the first combiner and the second multiplier in the second combiner to produce a first multiplied-combined data symbol of the first and second channels, a first data symbol associated with the third channel is multiplied in the third multiplier delayed from the time of multiplying the first data symbol associated with the second channel is multiplied, combining in the third combiner the first multiplied-combined data symbol of the first and second channels with an output of the third multiplier to produce a first multiplied-combined data symbol of the first, second, and third channels.

7. The communication apparatus of claim 6, wherein multiplying the first data symbol associated with the second data channel is delayed at least one chip time from multiplying the first data symbol associated with the first channel.

8. The communication apparatus of claim 6, wherein multiplying the first data symbol associated with the third data channel is delayed at least one chip time from multiplying the first data symbol associated with the second channel.

9. The communication apparatus of claim 6, further comprising:
a fourth channel of the plurality of channels, wherein a first data symbol associated with the fourth channel is multiplied in the first multiplier, and an output of the first multiplier is combined with the first multiplied-combined data symbol of the first, second, and third channels that is feedback from the third combiner to produce a first multiplied-combined data symbol of the first, second, third, and fourth channels.

10. The communication apparatus of claim 9, wherein multiplying the first data symbol associated with the fourth data channel is delayed at least one chip time from multiplying the first data symbol associated with the third channel.

11. A communication apparatus for use with a plurality of channels each channel having a block of data for transmission, the communication apparatus comprising:
a third multiplier operative to multiply data symbols associated with a third channel of the plurality of channels;
wherein a first data symbol associated with a first data channel is multiplied in a first multiplier, a first data symbol associated with a second data channel is multiplied in a second multiplier delayed from the time of multiplying the first data symbol associated with the first channel is multiplied, combining outputs of the first and second multipliers in a second combiner to produce a first multiplied-combined data symbol of the first and second channels, a first data symbol associated with the third channel is multiplied in the third multiplier delayed from the time of multiplying the first data symbol associated with the second channel is multiplied, combining in a first combiner the first multiplied-combined data symbol of the first and second channels with an output of the third multiplier to produce a first multiplied-combined data symbol of the first, second, and third channels.

12. The communication apparatus of claim 11, further comprising:
a fourth channel of the plurality of channels, wherein a first data symbol associated with the fourth channel is multiplied in the first multiplier, and an output of the first multiplier is combined with the first multiplied-combined data symbol of the first, second, and third channels that is feedback from the first combiner to produce a first multiplied-combined data symbol of the first, second, third, and fourth channels.

13. A communication apparatus for use with a plurality of channels each channel having a block of data for transmission, comprising:
a first means for multiplying a first data symbol of a first block of data associated with a first channel of the plurality of channels;
a second means for multiplying a first data symbol of a second block of data associated with a second channel;
a first means for combining said first multiplied data symbol of said first block of data and said first multiplied data symbol of said second block of data to produce a first multiplied-combined data symbol, wherein multiplying of said first data symbol of said second channel in said second means for multiplying is delayed by at least one chip time from multiplying of said first data symbol in said first means for multiplying, and a third means for multiplying of a first data symbol of a third block of data associated with a third channel, and wherein said first multiplied-combined data symbol is fed to a second means for combining that sums said first multiplied-combined data symbol with said multiplied first data symbol of said third block of data to produce a final first multiplied-combined data symbol.

14. A communication apparatus for use with a plurality of channels each channel having a block of data for transmission, comprising:
a first means for covering/combining, comprising a first means for multiplying and a first means for combining coupled to the first means for multiplying, the first means for multiplying multiplies data symbols associated with a first channel of the plurality of channels;
a second means for covering/combining, comprising a second means for multiplying and a second means for combining coupled to the second means for multiplying, wherein the second means for multiplying multiplies data symbols associated with a second channel of the plurality of channels; and
a third means for covering/combining, comprising a third means for multiplying and a third means for combining coupled to the third means for multiplying, the third means for multiplying multiplies data symbols associated with a third channel of the plurality of channels;
wherein a first data symbol associated with the first data channel is multiplied in the first means for multiplying and an output means of said first means for multiplying is provided to the first means for combining, a first data symbol associated with the second data channel is multiplied in the second means for multiplying delayed from the time of multiplying the first data symbol associated with the first channel is multiplied, combining outputs of the first means for combining and second means for multiplying in the second means for combining to produce a first multiplied-combined data symbol of the first and second channels, a first data symbol associated with the third channel is multiplied in the third means for multiplying delayed from the time of multiplying the first data symbol associated with the second channel is multiplied, combining in the third means for combining the first multiplied-combined data symbol of the first and second channels with an output of the third means for multiplying to produce a first multiplied-combined data symbol of the first, second, and third channels.

15. The communication apparatus of claim 14, wherein multiplying the first data symbol associated with the second data channel is delayed at least one chip time from multiplying the first data symbol associated with the first channel.

16. The communication apparatus of claim 14, wherein multiplying the first data symbol associated with the third data channel is delayed at least one chip time from multiplying the first data symbol associated with the second channel.

17. The communication apparatus of claim 14, further comprising:
a fourth channel of the plurality of channels, wherein a first data symbol associated with the fourth channel is multiplied in the first means for multiplying, and an output of the first means for multiplying is combined with the first multiplied-combined data symbol of the first, second, and third channel that is feedback from the third means for combining to produce a first multiplied-combined data symbol of the first, second, third, and fourth channels.

18. The communication apparatus of claim 17, wherein multiplying the first data symbol associated with the fourth data channel is delayed at least one chip time from multiplying the first data symbol associated with the third channel.

* * * * *